United States Patent [19]

Alter

[11] Patent Number: 5,589,702
[45] Date of Patent: Dec. 31, 1996

[54] HIGH VALUE GATE LEAKAGE RESISTOR

[75] Inventor: Martin J. Alter, Los Altos, Calif.

[73] Assignee: Micrel Incorporated, San Jose, Calif.

[21] Appl. No.: 418,748

[22] Filed: Apr. 10, 1995

Related U.S. Application Data

[62] Division of Ser. No. 180,579, Jan. 12, 1994, Pat. No. 5,439,841.

[51] Int. Cl.⁶ ................................................. H01L 29/00
[52] U.S. Cl. .......................... 257/379; 257/380; 257/537; 257/538
[58] Field of Search ...................... 257/364, 379, 257/380, 537, 538

[56] References Cited

U.S. PATENT DOCUMENTS

| | | | |
|---|---|---|---|
| 3,474,304 | 10/1969 | Currin et al. | 317/234 |
| 3,576,478 | 4/1971 | Watkins et al. | 317/235 |
| 4,070,653 | 1/1978 | Rao et al. | 365/222 |
| 4,092,735 | 8/1978 | McElroy | 365/183 |
| 4,208,781 | 6/1980 | Rao et al. | 29/577 C |
| 4,352,997 | 10/1982 | Raymond, Jr. et al. | 307/279 |
| 4,618,872 | 10/1986 | Baliga | 357/23.4 |
| 4,645,948 | 2/1987 | Morris et al. | 307/296 |
| 4,769,589 | 9/1988 | Rosenthal | 323/313 |
| 4,862,241 | 8/1989 | Ashida et al. | 357/45 |
| 4,896,243 | 1/1990 | Chatterjee et al. | 362/91 |
| 4,987,093 | 1/1991 | Teng et al. | 437/69 |
| 5,003,361 | 3/1991 | Lancaster . | |
| 5,081,439 | 1/1992 | Natzle et al. | 338/195 |
| 5,105,256 | 4/1992 | Koshimaru | 357/68 |
| 5,134,088 | 7/1992 | Zetterlund | 437/60 |
| 5,227,327 | 7/1993 | Sasaki | 437/60 |
| 5,227,655 | 7/1993 | Kayama | 257/380 |
| 5,241,206 | 8/1993 | Lee | 257/380 |
| 5,304,502 | 4/1994 | Hanagasaki | 437/41 |
| 5,323,045 | 6/1994 | Murai | 257/380 |
| 5,334,550 | 8/1994 | McElroy et al. | 437/65 |

OTHER PUBLICATIONS

P. U. Kenkare et al., "Sensitivity of Field Isolation Profiles To Active Pattern," IEEE, published Dec. 1993, IEDM 93, pp. 479–482.

*Primary Examiner*—Ngân V. Ngô
*Attorney, Agent, or Firm*—Skjerven Morrill, MacPherson, Franklin & Friel LLP; Brian D. Ogonowsky; Arthur J. Behiel

[57] ABSTRACT

In a preferred embodiment, a diffused leakage resistor of a high value between approximately 200K ohms and 5M ohm is formed proximate to an MOS power transistor on the same silicon chip. The manufacturer of the chip has the option, using a mask, to connect or not connect the dedicated leakage resistor between the transistor's source and gate during the fabrication of the chip. The resistor is formed using the same masking steps already used to form the MOS transistor. To increase the sheet resistivity (ohms per square) of the resistor, a novel method is used to cause the effective width of the diffused resistor to be substantially narrower than the actual drawn width dimension on the mask. Also using this novel method, the concentration and depth of the dopants forming the resistor diffused region are less than that of the source and drain regions. The resulting resistor will thus have a much higher sheet resistivity than is achieved using conventional methods.

22 Claims, 4 Drawing Sheets

5,589,702

HIGH VALUE GATE LEAKAGE RESISTOR

This application is a division of application Ser. No. 08/180,579, filed Jan. 12, 1994, now U.S. Pat. No. 5,439,841.

FIELD OF THE INVENTION

This invention relates to MOS transistors and, in particular, to a leakage resistor for removing a positive or negative charge from the gate of an MOS transistor.

BACKGROUND OF THE INVENTION

Metal-oxide-semiconductor (MOS) transistors incorporate a metal or conductive polysilicon gate which, when energized, inverts an underlying channel region between a source region and a drain region. The inverted channel region then acts as an ohmic path between the source and drain regions for conducting current across the MOS transistor. The amount of charge on the gate determines the conductivity of the channel region, and, in certain cases, it is desirable to quickly remove charge (positive or negative) from the gate to quickly turn the transistor off. If charge were allowed to remain on the gate after a voltage supply has been disconnected from the gate, this residual charge will cause the transistor to remain on for a certain period of time until the charge on the gate leaks off due to some parasitic resistance.

One way to discharge the gate of an MOS transistor is to switch the gate to a reference voltage (e.g., ground for an NMOS transistor) immediately after a driving voltage supply has been disconnected from the gate. The switching mechanism used to discharge the gate is usually another transistor connected between the gate and the reference voltage. This discharging transistor frequently requires additional masking steps to form and requires some control circuitry for switching the discharging transistor at the proper time.

Another known way to remove residual charge from the gate of an MOS transistor is to provide a large value resistor between the gate and a reference voltage to act as a weak pull-down device (for an NMOS transistor) or pull-up device (for a PMOS transistor). When a driving voltage is applied to the gate to turn the transistor on, only a small leakage current flows through the high value resistor. When the driving voltage is removed from the gate, the small residual charge on the gate is quickly removed by the resistor. High value leakage resistors are commonly formed by MOS depletion transistors having a long and narrow gate to achieve the high resistance value, but these resistors require additional masking steps.

The high value resistor is frequently provided as a discrete device (not on the same chip as the transistor) which is connected between the gate of an MOS power transistor and a reference voltage terminal. These discrete devices take up printed circuit board area, require manufacturing time to interconnect the resistor between the gate and the reference voltage terminal, and are relatively expensive.

What is needed is a high value leakage resistor for an MOS transistor which takes up little area and can be formed on the same wafer as the MOS transistor without using any additional masking steps. Ideally, this resistor can be hidden or buried under the transistor's non-active areas, such as the bonding pads or metal interconnects, and hence, not require any additional die area.

SUMMARY

In a preferred embodiment, a diffused P or N-type resistor of a high value between approximately 200K ohms and 5M ohm is formed proximate to an MOS power transistor on the same silicon chip. The purchaser of the chip containing the MOS power transistor and the leakage resistor may request the manufacturer to connect or not connect the dedicated leakage resistor between the source and the gate during a metallization step in the fabrication of the chip.

In a preferred embodiment, the resistor is formed by diffusing a P-type dopant into an N-type substrate (assuming a PMOS transistor is also being formed) so as to form a long but narrow region of diffused material. The resulting resistor value may be made virtually any value by adjusting the width, length, depth, and doping concentration of the diffused region. A very long resistor may be formed in a serpentine shape.

Preferably, the resistor is formed using the same masking steps already used to form the MOS transistor. Accordingly, the P-type dopant which forms the resistor must also form the P+ source and drain regions of the P-channel MOS transistor during the same implantation step. To increase the sheet resistivity (ohms per square) of the resistor without requiring any additional masking steps, a novel method is used to cause the width of the P dopant diffusion in the resistor to be narrower than the actual drawn contact mask dimension and effect a relatively high effective sheet resistance despite a relatively high implant dose. Also using this novel method, the dosage and depth of the P dopants forming the diffused resistor region are less than that of the source and drain regions while using the same relatively high dose source/drain implant. The resulting resistor will thus have a higher sheet resistivity than is achieved using conventional methods and, hence, the resistor can be made smaller than prior art resistors of the same value.

Using the novel method, the resulting diffused resistor region will be very narrow and shallow but still have a fairly high doping level. Hence, the temperature coefficient of the resulting resistor will be relatively low, as compared to a more lightly doped resistor.

The process used to form the narrow resistor may be adjusted to achieve any resistivity without affecting the dimensions or electrical characteristics of the source and drain regions formed during the same implantation step.

Additionally, a (diodeless) polysilicon resistor and thin film resistor are also described which may be used when the gate is to be driven to a voltage more than 0.7 volts (i.e., a diffused resistor's PN junction forward bias voltage) above the transistor's source (assuming a PMOS transistor). This may occur in situations where a 5 volt supply drives the gate, while the transistor's source region is connected to a 3 volt supply.

DETAILED DESCRIPTION OF THE PREFERRED EMBODIMENTS

Figure 1:
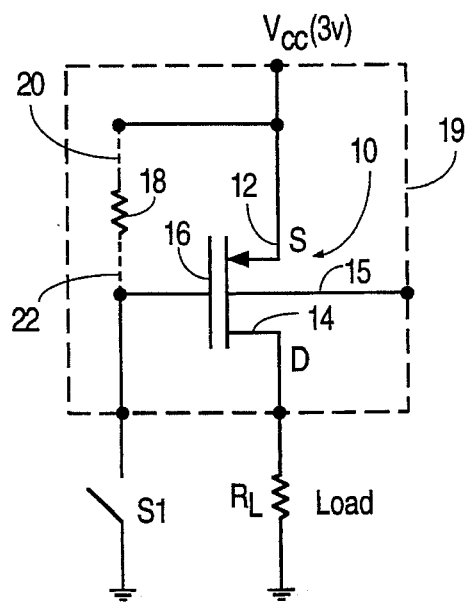
FIG. 1 is a schematic diagram of a conventional PMOS transistor with a leakage resistor formed in accordance with this invention.

FIG. 1 illustrates a conventional P-channel MOS transistor 10 having a P+ source 12, a P+ drain 14, an N-substrate 15, and a conductive gate 16. Substrate 15 may be shorted to source 12 if desired, or substrate 15 may be connected to a separate bias voltage. A P-type diffused resistor 18 is located proximate to transistor 10 on the same chip 19 and is connectable between the gate 16 and the source 12 using a contact and/or metal mask option, whereupon deposited metal electrically connects the end points of the resistor 18 to the gate 16 and source 12, respectively. The selectable connection of the resistor 18 to the gate 16 and source 12 during the contact and/or metallization step is illustrated by dashed lines 20 and 22.

A switch S1 is closed to turn PMOS transistor 10 on, and switch S1 is opened to turn transistor 10 off. When switch S1 is switched from closed to open, the leakage resistor 18 pulls up the gate 16 to $V_{cc}$, thus quickly turning off the transistor 10 and avoiding an indeterminate state.

Although the preferred embodiment will be described as a P-channel transistor and a P-type diffused resistor formed in an N-type substrate, the concepts used in this invention may be equally applicable to form an N-channel transistor and an N-type diffused resistor. As long as the conductivity type of the source and drain regions is the same as the conductivity type of the resistor diffusion, the resistor 18 may be formed in the same substrate 15 as transistor 10 without any additional masking or diffusion steps. Additionally, the concepts described herein are equally applicable to forming a leakage resistor for DMOS transistors as well as for forming a high value resistor between the base and emitter of a bipolar transistor to prevent snapback.

Figure 2:
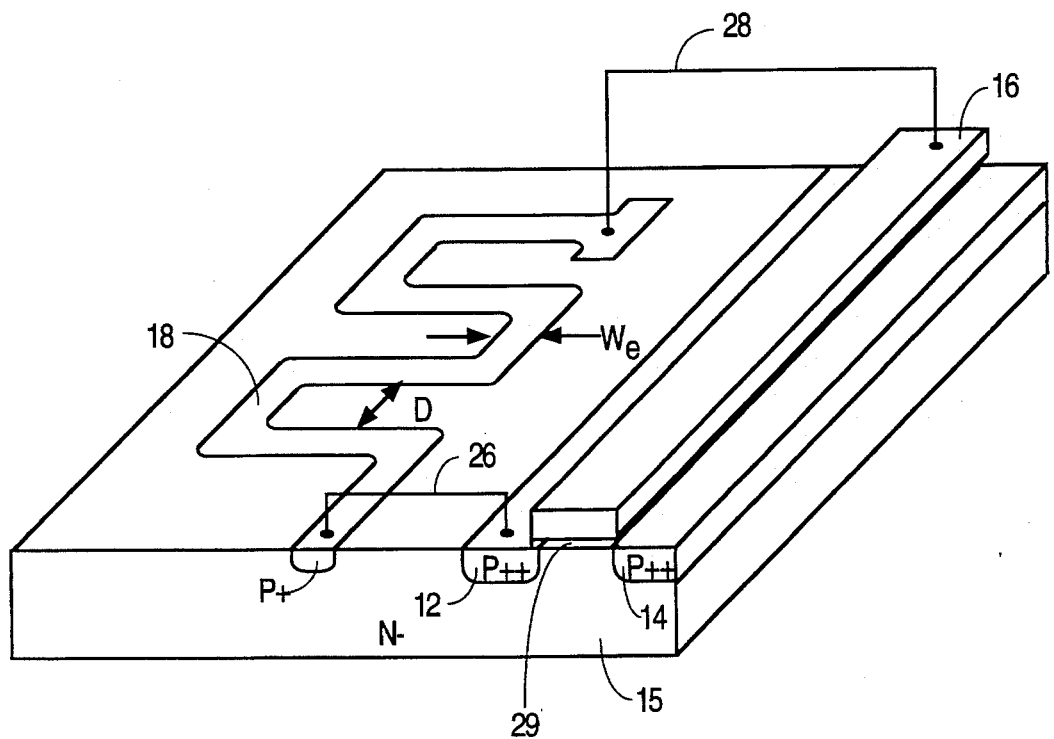
FIG. 2 is a simplified perspective view of the surface of a wafer portion illustrating a conventional PMOS transistor and the novel diffused resistor.
Figure 3:
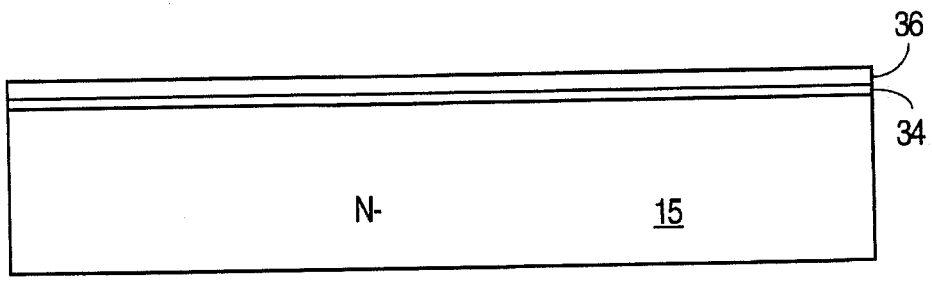
FIGS. 3, 4, 5, 6, 7, 8, and 9 are simplified cross-sections of a PMOS transistor and the novel diffused resistor at various stages in their fabrication, with FIG. 9 showing the completed PMOS transistor and resistor configuration.

FIG. 2 is a simplified perspective view of a portion of the top surface of a semiconductor wafer, illustrating one configuration of MOS transistor 10 and diffused resistor 18. In the embodiment of FIG. 2, resistor 18 is formed in a serpentine fashion to allow the resistor 18 to have a relatively long length but take up a relatively small area on the substrate 15 surface. The resistor 18 and transistor 10 are shown formed in an N-type substrate 15. One end of resistor 18 is shown connected to source 12 via a metal portion 26 while the other end of resistor 18 is shown connected to the conductive gate 16 by metal portion 28.

A thin layer of gate oxide 29 separates the conductive gate 16 from the substrate 15 so that a negative gate voltage with respect to the source 12 inverts the channel directly beneath gate 16 so as to form a P-type conduction path between the P+ source 12 and P+ drain 14. Once the gate voltage is removed from the gate, the gate remains negatively charged, and this charge is leaked off the gate 16 by the resistor 18 connected between the gate 16 and the source 12. In the preferred embodiment, the resistance of resistor 18 is between 500K ohms and 1M ohm so as to remove the residual charge from the gate 16 but not draw any significant amount of standby current when a positive voltage source (e.g., $V_{cc}$) is connected to gate 16. The value of resistor 18 may be virtually any value between approximately 50K ohms and 5M ohm, or greater, depending upon how fast it is desired to remove the charge from gate 16. The lowest practical value is set by the acceptable standby current, and the highest practical value is set by the maximum allowable turn-off time, taking into account the amount of parasitic leakage one expects to encounter in the finished application (on a PC board for example).

In one embodiment, the effective width $W_e$ of the resistor 18 is between approximately 1.0–2.5 microns, and the distance D between the folds of the serpentine resistor 18 is about 3 microns.

In one embodiment, the resistivity of the source 12 and drain 14 is approximately 85 ohms per square, while the resistivity of the P diffusion in resistor 18 is on the order of 300 ohms per square even though the resistor 18 was formed using the same implantation step as used to form the source 12 and drain 14. The higher resistivity of resistor 18 enables the length of the resistor 18 to be much shorter than if the resistor 18 had the same resistivity as the source 12 and drain 14, and the area taken up by resistor 18 is much less than an equivalent value resistor formed using conventional processes. Although the resistivity of resistor 18 is relatively high, the doping density within resistor 18 is such that the resistor 18 will have a relatively low temperature coefficient as compared to conventional diffused resistors using lighter doping.

The resulting total resistance of resistor 18 may be calculated by multiplying the resistivity by the number of squares used to form the entire length of resistor 18. In one embodiment, the total length of resistor 18 is 1350 squares (each with sides of 2.5 microns), resulting in a total resistance value on the order of 400K ohms.

Resistor 18 may take on any shape without affecting its performance. For example, the serpentine shape does not have to be symmetrical but may contain any angles and patterns which will enable the resistor 18 to fit within an available area on the surface of the substrate 15.

The particular structure shown in FIG. 2 finds wide application where MOS transistor 10 is a power transistor having a relatively large gate 16 and low on-resistance.

In a preferred embodiment, MOS transistor 10 is actually a transistor array comprising many hundreds of cellular transistors using a common mesh type gate. In the preferred embodiment, the gate for each of the cells resembles a propeller shape such as that described in copending U.S. application Ser. No. 08/155,029, entitled "Diamond Shaped Gate Mesh For Cellular MOS Transistor Array," by Moyer et al, filed Nov. 19, 1993, assigned to the present assignee and incorporated herein by reference.

FIGS. 3–9 are cross-sectional views of the resulting MOS transistor 10 and diffused resistor 18 formed in the preferred embodiment process. The dimensions of the various layers and regions are enlarged or reduced, as required, to simplify the illustrations and to better convey the principles of the present invention.

In the formation of a P-type diffused resistor 18 and a P-channel MOS transistor 10, an N-type silicon substrate 15 is used. In one embodiment, substrate 15 is <100> orientation and has a resistivity of approximately 0.4 ohms-cm. (A similar N-channel MOS transistor and N-type diffused resistor could be formed in a P-type silicon substrate having a resistivity of approximately 6 ohms-cm.)

A thin layer of oxide 34 on the order of 750 Angstroms is grown over the surface of the silicon substrate 15. This oxide 34 not only acts as a pad to reduce stress between a subsequent nitride layer and the silicon but is used to enable additional oxide to extend under the nitride layer to reduce the width of the resulting P diffusion forming the resistor, to be described in greater detail later.

Next, a layer of silicon nitride 36 approximately 1500 Angstroms thick is deposited over oxide 34.

Figure 4:
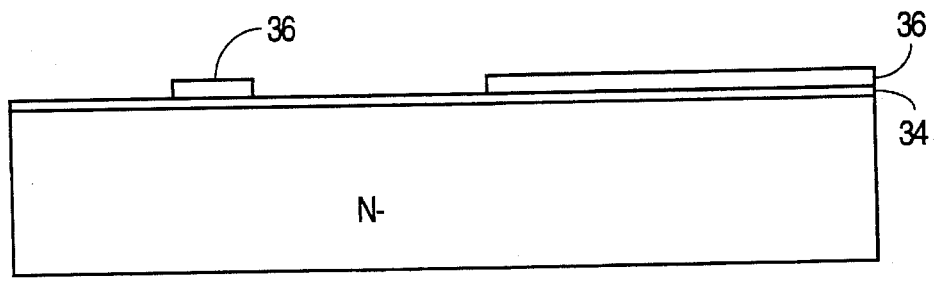

In FIG. 4, portions of the nitride 36 and oxide 34 are then etched away, using conventional photolithographic and etching methods, in areas where it is desired to grow a relatively thick layer of field oxide. The portions of nitride 36 remaining on the surface of the substrate 15 in FIG. 4 correspond to where the resistor 18 and MOS transistor 10 are to be subsequently formed. The masking and etching step illustrated in FIG. 4 would normally be conducted anyway to form the MOS transistor 10.

A process option is to also etch the oxide 34 away and further undercut the nitride 36 (by significant oxide 34 overetch) to thereby obtain an even narrower resistor width.

Figure 5:
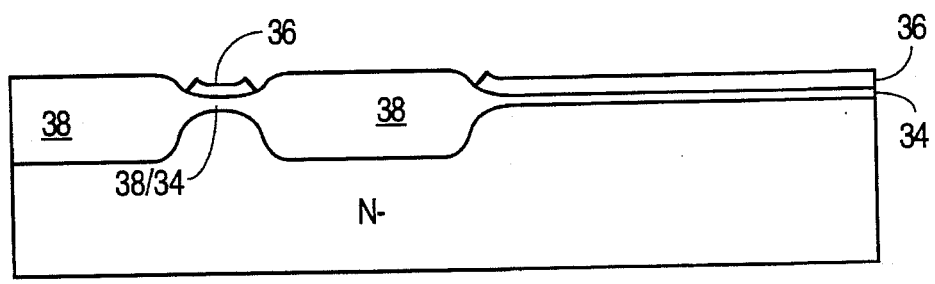

In FIG. 5, a conventional wet oxidation process is conducted to grow localized thick oxide 38 over the exposed silicon surfaces to a thickness on the order of 1 micron. This results in the well known "bird's beak effect," where the beak-shaped edges of the oxide 38 encroach under the nitride 36 portions to lift up the edges of the nitride 36 portions as shown in FIG. 5. A thicker oxide 34, initially formed in FIG. 3, or a thicker field oxide as in FIG. 5, would cause the bird's beak to encroach an even greater amount under nitride 36 during the thick field oxidation. As will be seen, the extent of encroachment of this bird's beak under nitride 36 affects the resulting width of the diffused resistor 18, where a narrower width of the resistor 18 results in a higher resistance value per unit length of the resistor 18. In the embodiment shown in FIG. 5, the bird's beak of oxide 38 on both sides of the nitride 36 portion merge together under nitride 36 to form a layer of oxide 38/34 under nitride 36, with an oxide thickness at the center being thicker than the original oxide 34. This center of the nitride 36 portion corresponds to the center of the resistor 18.

Figure 6:
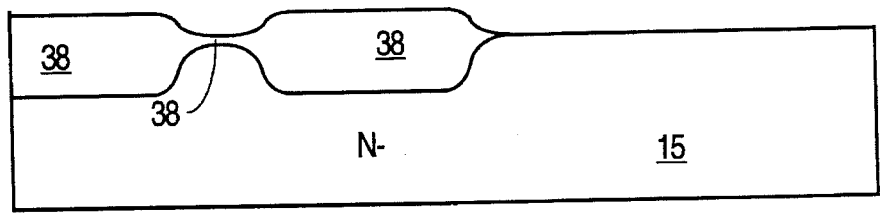

In FIG. 6, the nitride 36 and thin oxide 34 portions have been stripped away, using conventional blanket etching methods, to expose the silicon substrate 15 on the right side of FIG. 6 where the MOS transistor 10 is to be formed. Since the bird's beaks of oxide 38 had extended under the nitride 36, a certain amount of oxide 38 remains over where the resistor 18 is to be formed. The thickness of oxide 38 over where the resistor 18 is to be formed will affect the dosage, depth, resistivity, and width of the resulting resistor 18.

Figure 7:
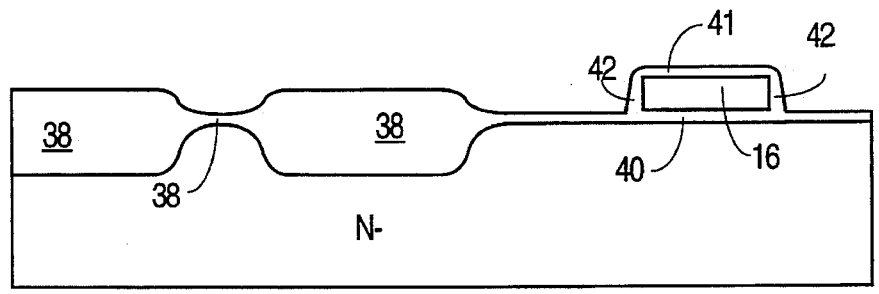

As shown in FIG. 7, a thin layer (e.g., 500 Angstroms) of gate oxide 40 is then grown over the surface of the wafer using a conventional dry oxidation step. (Note that this gate oxide 40 layer is much thinner than the oxide 38 remaining over the intended resistor region but has been greatly enlarged in FIG. 7 for illustration purposes.) The gate oxide 40 and an overlying oxide layer (subsequently grown during poly oxidation) will not substantially affect the implantation depth of P-type ions implanted in a subsequent implantation step.

A polysilicon layer is then deposited over the surface of the wafer, using conventional techniques, and doped with $POCL_3$ to make the polysilicon highly conductive. The resulting polysilicon layer is then etched to form polysilicon gate 16 in any desired pattern. The surface of the wafer, including polysilicon gate 16, is then oxidized to provide side oxide spacers 42 and, at the same time, form an additional thin layer of oxide (not labelled) over field oxide 38 and gate oxide 40.

Figure 8:
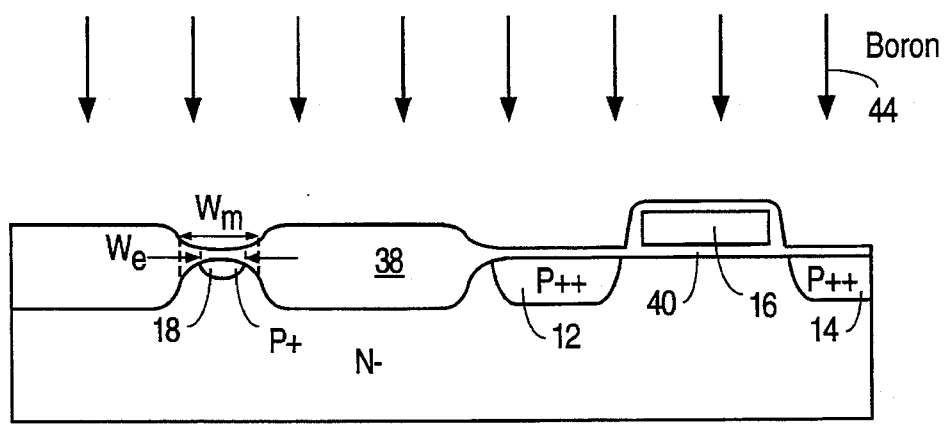

Next, as shown in FIG. 8, boron ions 44 are blanket implanted into the surface of the wafer such that the relatively thick oxide 38 and the polysilicon gate 16 act as masks to block boron ions 44 from entering into the underlying silicon 15. The oxide 38 over the intended resistor 18 region will block the implantation of boron ions 44 to varying degrees depending upon the thickness of the oxide 38. This causes the resulting P+ diffused resistor 18 to be formed shallower than the source 12 and drain 14 (this effect is enhanced by using $BF_2$ as an implant source instead of B11+) and thereby have a higher sheet resistivity than the source 12 and drain 14. Additionally, due to the encroachment of the bird's beak under the nitride 36 in FIG. 5, the implantation of boron ions 44 will form a P+ diffused resistor 18 which has much less effective width $W_e$ than the original drawn mask dimension $W_m$ (e.g., 2.5 microns or greater). Accordingly, the dimensions and electrical characteristics of the resulting resistor 18 illustrated in FIG. 2 can be selected to be virtually independent of the size and electrical characteristics of the source 12 and drain 14. The shallower, narrower, and more lightly doped the P+ diffused resistor 18, the less area need be taken up by the resistor 18 to achieve a predetermined resistor value. By allowing the diffused resistor 18 to still have a relatively high doping level (on the order of $10^{18}$ ions/cm$^3$), the temperature coefficient of the resulting resistor 18 remains relatively low, in contrast to lightly doped diffused resistors or depletion mode type transistors.

As seen, the resulting resistor 18, having virtually any value, may be formed with no additional masking steps and formed concurrently with the self-aligned MOS transistor 10. Additionally, the width of the resistor 18 may be adjusted considerably by process variations in such a way that the proximate MOS transistor is substantially not affected.

In one embodiment, the boron ions 44 in FIG. 8 are implanted into the surface of the wafer at a dosage of approximately $3\times10^{15}$ ions/cm$^2$ and at an energy of approximately 35 keV using a B11+source. The optimum dosage and energy will depend upon details of the particular process parameters used and the desired operating characteristics of the device. The dopants may be diffused and activated in a subsequent heating step.

Figure 9:
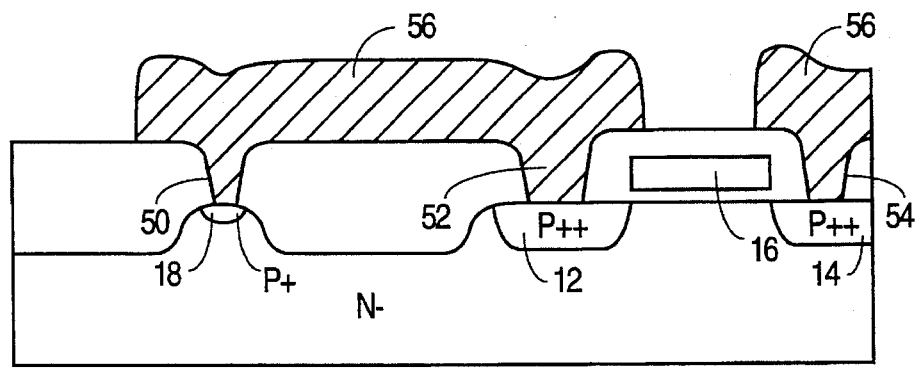

In FIG. 9, another layer of oxide is then deposited on the surface of the wafer, and contacts, such as contacts 50, 52, and 54, are formed through the insulating oxide prior to a metallization step. An additional contact would be formed at the other end of the resistor 18.

Next, a metal deposition and masking step using, for example, aluminum or an aluminum alloy is then conducted to electrically connect one end of the resistor 18 to a source 12 terminal and the other end of the resistor 18 to a gate 16 terminal, such as shown in FIG. 2. The metal 56 is etched to form the various interconnections. In an actual embodiment, the ends of resistor 18 terminate under a large source metal pad and a large gate metal pad.

The preferred embodiment method for forming the resistor 18, having virtually any width, may also be used to form a resistor which is not intended for use as a leakage resistor between a gate of a transistor and its source but simply as a relatively compact, high value resistor.

Figure 10:
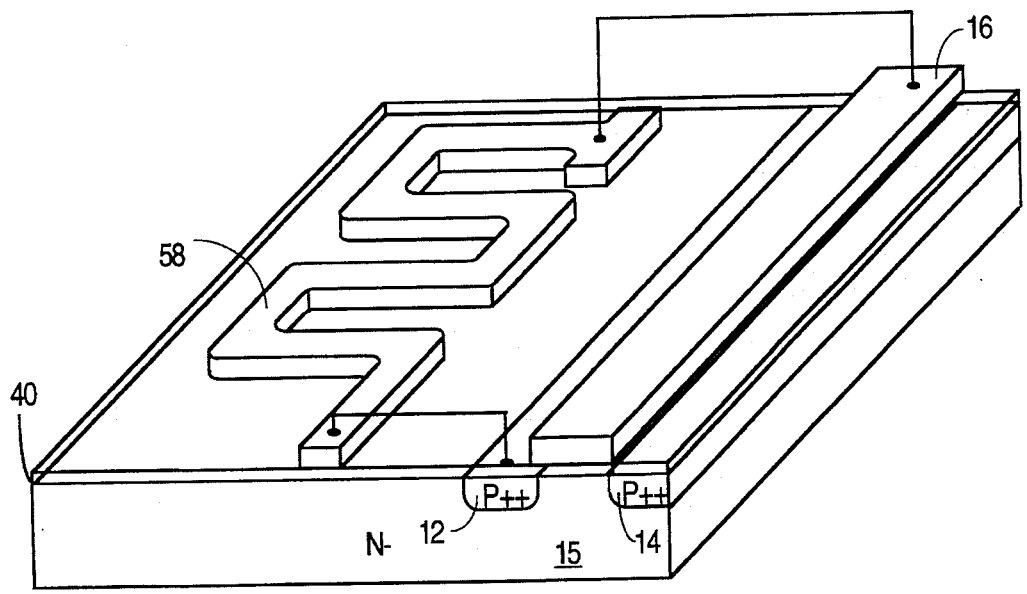
FIG. 10 illustrates a novel arrangement of a polysilicon leakage resistor and a PMOS transistor.

FIG. 10 illustrates another embodiment of the invention where, instead of a diffused leakage resistor, a polysilicon resistor 58 is formed at the same time that gate 16 is formed. Thus, no additional masking steps are needed to form resistor 58. However, the resistivity of the resistor 58 and gate 16 would be relatively low (e.g., 15 ohms per square), so that the resistor 58 will have to be relatively long to achieve a desired resistance value on the order of 500K ohms. If desired, polysilicon resistor 58 may be doped separately from gate 16 to achieve a very high resistivity (e.g., up to 1M ohm per square), but this would require an additional masking step and additional processing.

The polysilicon resistor 58 is advantageous over the diffused resistor 18 in FIG. 2 in that the gate 16 may now be driven to a voltage greater than 0.7 volts above the substrate 15, since the diode clamp associated with diffused resistors would not exist.

Figure 11:
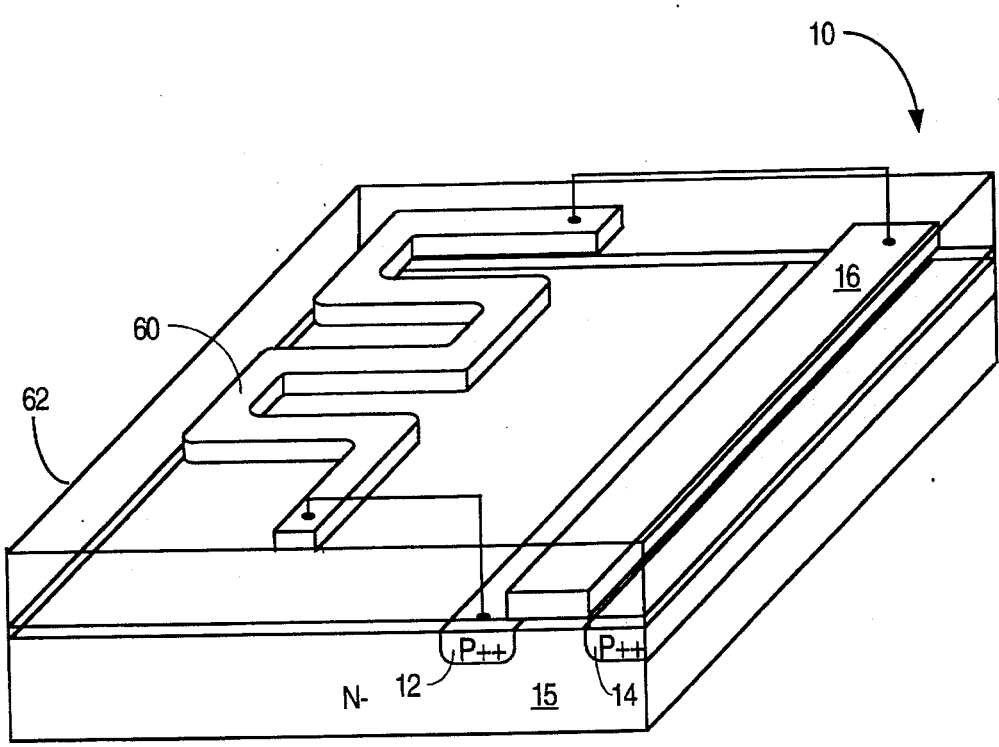
FIG. 11 illustrates a novel arrangement of a thin film, metal leakage resistor and a PMOS transistor.

FIG. 11 illustrates a thin film, metal leakage resistor 60 which can be formed to have virtually any resistivity value (e.g., 2000 ohms per square). In one embodiment, the thin film material is a silicon-chrome alloy which has been co-sputtered onto oxide layer 62 to a thickness on the order of 100 Angstroms. Forming resistor 60 requires additional masking and processing steps over that needed to form MOS transistor 10, but the thin film resistor 60 also allows the gate 16 to be driven to a voltage greater than 0.7 volts above the substrate 15 and can have very high sheet resistivity.

In all the specific resistor embodiments shown, the resistor is a dedicated leakage resistor formed on the same substrate as the MOS transistor 10.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A device comprising:

a semiconductor substrate;

an MOS transistor having a gate, a source region, and a drain region, said source region and said drain region formed in said semiconductor substrate to a first diffusion depth and having a first dopant concentration; and a high value gate leakage resistor for providing a specified resistance between a first node and a second node, said resistor formed proximate to said MOS transistor on said substrate, said resistor having a first end for connection to said gate and a second end for connection to a current sink, wherein said resistor comprises a diffusion region formed in said substrate by implanting dopants into said substrate through an oxide portion less than a first thickness, said oxide portion less than said first thickness formed by ends of two opposing bird's beaks which have merged together, oxide portions greater than said first thickness blocking said dopants from implanting into said substrate, wherein the resistivity of said resistor is controlled by controlling the extent of merging of said bird's beaks.

2. The device of claim 1 wherein said resistor comprises a diffusion region having a second diffusion depth substantially less than said first diffusion depth, and wherein an effective width of said diffusion region is less than a minimum dimension obtainable using masking and etching processes for forming said MOS transistor.

3. The device of claim 2 wherein said diffusion region has a selected cross-sectional area, said cross-sectional area and a dopant concentration of said diffusion region being selected to provide a desired resistance.

4. The device of claim 1 wherein said second end of said resistor is connected to said source region of said MOS transistor.

5. The device of claim 1 wherein said source region and said drain region of said MOS transistor is of a first conductivity type, and said resistor is formed of a diffusion region also of said first conductivity type.

6. The device of claim 1 wherein said specified resistance is selected based upon a desired leakage resistance between said gate and said current sink.

7. The device of claim 1 wherein said resistor is formed without any additional masking steps over that used to form said MOS transistor.

8. The device of claim 7 wherein said resistor comprises a diffusion region, and a resistivity of said resistor is substantially greater than a resistivity of either said source region or said drain region of said MOS transistor.

9. The device of claim 1 wherein an effective width of said resistor is less than a minimum dimension obtainable using masking and etching processes for forming said MOS transistor.

10. The device of claim 1 wherein said MOS transistor and said resistor are the only components formed on a single integrated circuit chip.

11. The device of claim 1 wherein said resistor has a resistance value of between approximately 50K ohms and 5M ohms.

12. A device comprising:

a semiconductor substrate;

an MOS transistor having a gate, a source region, and a drain region, said MOS transistor having a conductive state when a first voltage is applied to said gate, said MOS transistor having a nonconductive state when a second voltage is applied to said gate, said source region and said drain region formed in said semiconductor substrate to a first diffusion depth and having a first dopant concentration; and a high value gate leakage resistor for providing specified resistance between a first node and a second node, said resistor formed proximate to said MOS transistor on said substrate, said resistor having a first end connected to said gate and a second end connected to second voltage and not to said first voltage, wherein said resistor and said gate are polysilicon, said device further comprising a first oxide layer disposed over said substrate over which is formed said gate having a second dopant concentration and said resistor having a third dopant concentration.

13. The device of claim 12 wherein said resistor has a selected cross-sectional area, said cross-sectional area and said third dopant concentration being selected to provide a desired resistance.

14. The device of claim 13 wherein said gate and said resistor are formed during the same process steps such that said third dopant concentration is substantially equal to said second dopant concentration.

15. The device of claim 12 wherein said resistor is formed at the same time as the formation of said gate.

16. The device of claim 15 wherein said polysilicon forming said resistor has a same resistivity as said gate.

17. A device comprising:

a semiconductor substrate;

an MOS transistor having a gate, a source region, and a drain region, said MOS transistor having a conductive state when a first voltage is applied to said gate, said MOS transistor having a nonconductive state when a second voltage is applied to said gate, said source region and said drain region formed in said semiconductor substrate to a first diffusion depth and having a first dopant concentration; and a high value gate leakage resistor for providing a specified resistance between a first node and a second node, said resistor formed proximate to said MOS transistor on said substrate, said resistor having a first end connected to said gate and a second end connected to said second voltage and not to said first voltage, wherein said resistor is a thin film resistor.

18. The device of claim 17 further comprising a first oxide layer on which is formed said gate, and a second oxide layer formed over said gate and between said resistor and said first oxide layer.

19. The device of claim 17 wherein said resistor is metal.

20. The device of claim 19 wherein said metal is a silicon-chrome alloy.

21. The device of claim 1 wherein said first end of said resistor is programmably connectable to said gate.

22. The device of claim 21 wherein programming is performed by forming a contact between a metal layer and said first end of said resistor.

* * * * *